(12) United States Patent
Katz

(10) Patent No.: US 6,686,221 B1
(45) Date of Patent: Feb. 3, 2004

(54) METHOD FOR FORMING PACKAGED SEMICONDUCTOR DEVICE HAVING STACKED DIE

(75) Inventor: Anne T. Katz, Santa Clara, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 0 days.

(21) Appl. No.: 10/231,636

(22) Filed: Aug. 30, 2002

(51) Int. Cl.[7] .......................... H01L 21/44; H01L 21/48; H01L 21/50
(52) U.S. Cl. ...................................................... 438/106
(58) Field of Search ................................ 438/127, 106, 438/118, 111–112, 108–109, 124

(56) References Cited

U.S. PATENT DOCUMENTS

| 5,323,060 A | 6/1994 | Fogal et al. |
| 6,337,226 B1 | 1/2002 | Symons |
| 6,337,227 B1 | 1/2002 | Ball |
| 6,340,846 B1 | 1/2002 | LoBianco et al. |
| 6,492,726 B1 * | 12/2002 | Quek et al. .................. 257/723 |

OTHER PUBLICATIONS

US2002/0030257A1 Brand "Semiconductor Device Utilizing an Encapsulant for Locking a Semiconductor Dit to Circuit Substrate" Mar. 14, 2002 (filed Jun. 18, 1999).*

* cited by examiner

Primary Examiner—Craig Thompson
(74) Attorney, Agent, or Firm—Glass & Associates; Kenneth Glass, Esq.

(57) ABSTRACT

A method for forming a packaged semiconductor device and a packaged semiconductor device. A first semiconductor die is coupled to a package substrate. Wire bonds are then coupled to the first semiconductor die and to the package substrate. Encapsulant is applied such that the encapsulant extends over the first semiconductor die and over the wire bonds. The encapsulant is then at least partially cured. A second semiconductor die is coupled to the encapsulant. The second semiconductor die is electrically coupled to the ball grid array substrate. Encapsulant is then applied and cured to form a second layer of encapsulant that covers the second semiconductor die.

12 Claims, 8 Drawing Sheets

METHOD FOR FORMING PACKAGED SEMICONDUCTOR DEVICE HAVING STACKED DIE

FIELD OF THE INVENTION

The present invention relates to the field of semiconductor devices. More specifically, the present invention relates to an apparatus and method for forming a packaged semiconductor device having stacked die.

BACKGROUND ART

Packaged semiconductor devices containing multiple semiconductor die provide high device density. In addition, packaged semiconductor devices containing multiple semiconductor die can provide increased functionality and performance.

Packaged semiconductor devices containing multiple semiconductor die typically include a first semiconductor die that is attached to a package substrate. Bonding pads are disposed around the periphery of the top surface of the first semiconductor die. Wire bonds electrically connect to the bonding pads on the first semiconductor die and electrically connect to corresponding bonding pads located on the package substrate. The spacer is then attached to the center of the top surface of the first semiconductor die.

The second semiconductor die is attached to the spacer. Bonding pads disposed on the top surface of the second semiconductor die are then electrically connected to bonding pads on the package substrate using wire bonds. Encapsulant is then applied so as to cover the semiconductor die and all of the wire bonds.

The manufacturing process for forming packaged semiconductor devices containing multiple semiconductor die is expensive. More particularly, spacers add cost to the manufacturing process. In addition, the spacer must be precisely placed so as to prevent damage to wire bonds.

Also, it is difficult to apply encapsulant such that the encapsulant will completely fill the areas surrounding the spacer. Often, air is trapped under the second semiconductor die in the areas surrounding the spacer. This causes voids within the encapsulant in the areas surrounding the spacer. This leads to a packaged semiconductor device having reduced structural integrity. Also, the voids can trap moisture, leading to reliability problems.

What is needed is a packaged semiconductor device and a method for forming a packaged semiconductor device having improved structural integrity and reliability. Also, a method and apparatus is needed that meets the above need while reducing manufacturing cost. The present invention meets the above needs.

DISCLOSURE OF THE INVENTION

The present invention provides a method for forming a packaged semiconductor device and a packaged semiconductor device in which encapsulant is used for separating stacked semiconductor die. The method and apparatus of the present invention reduces manufacturing cost while improving structural integrity and reliability.

A method for forming a packaged semiconductor device having stacked die and a packaged semiconductor device having stacked die are disclosed. A first semiconductor die is coupled to a ball grid array substrate. Wire bonds are then coupled to the first semiconductor die and to the ball grid array package substrate so as to electrically couple the first semiconductor die to the ball grid array package substrate.

Encapsulant is disposed over the first semiconductor die and over the wire bonds. The encapsulant is then at least partially cured. The encapsulant completely fills the area surrounding the first semiconductor die. Accordingly, no air pockets are formed that can cause integrity problems or reliability problems as can occur in prior art processes that use spacers.

A second semiconductor die is coupled to the encapsulant. In one embodiment, the second semiconductor die at least partially overlies the first semiconductor die. The second semiconductor die is then electrically coupled to the ball grid array substrate.

Encapsulant is then applied and cured to form a second layer of encapsulant that covers the second semiconductor die. The second layer of encapsulant completely fills the area surrounding the second semiconductor die. Accordingly, no air pockets are formed that can cause integrity problems or reliability problems as can occur in prior art processes that use spacers.

Because a spacer is not required, the method and apparatus of the present invention results in cost savings. Moreover, because the method and apparatus of the present invention does not result in the formation of voids, reliability and structural integrity problems are avoided as compared to prior art processes that use spacers.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part. of this specification, illustrate embodiments of the invention and, together with the description, serve to explain the principles of the invention.

The drawings referred to in this description should be understood as not being drawn to scale except if specifically noted.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
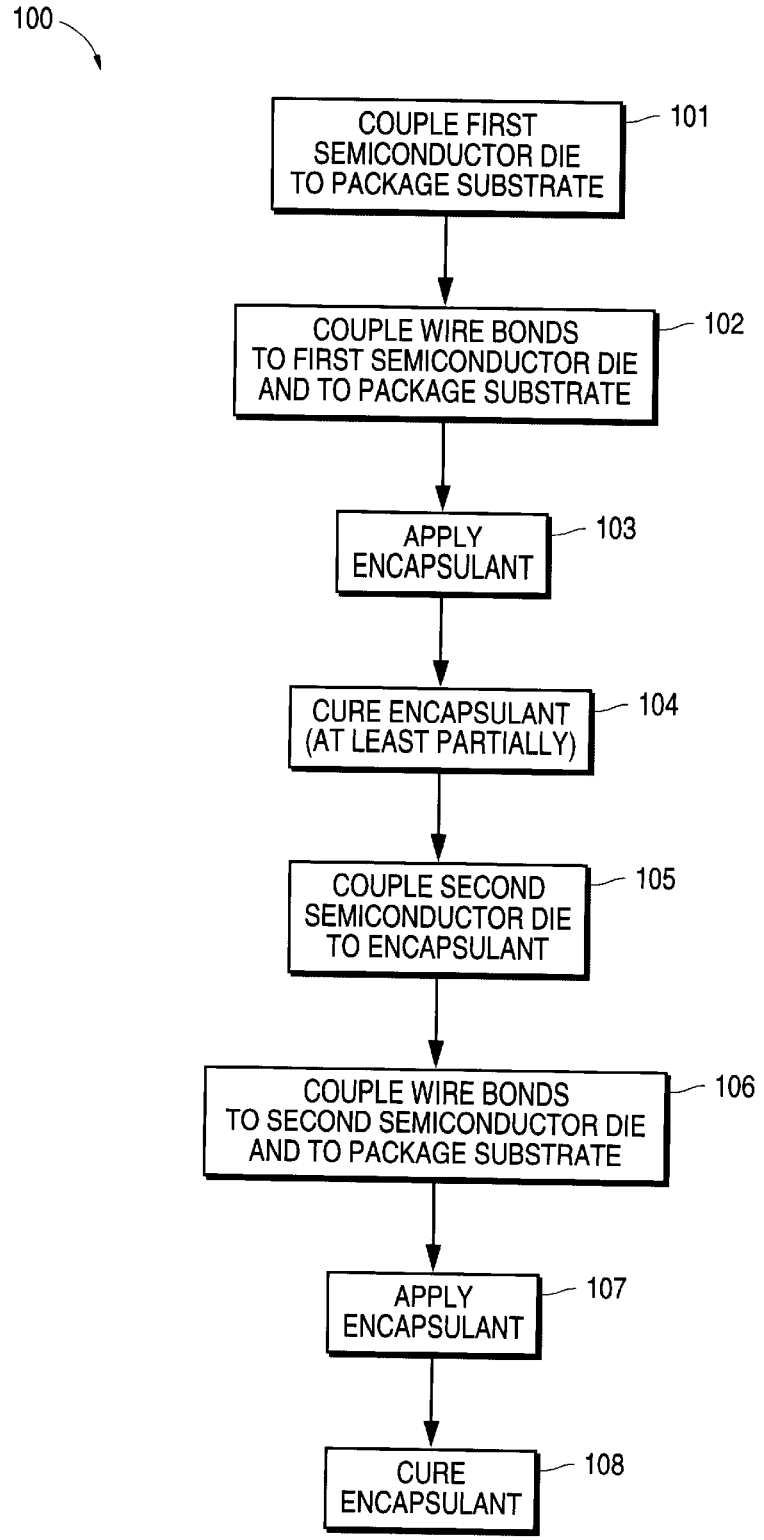
FIG. 1 is a flow chart that illustrates a method for forming a packaged semiconductor device in which die are stacked and in which encapsulant separates adjoining die in accordance with one embodiment of the present invention.

FIG. 1 illustrates a method 100 for forming a packaged semiconductor device. As shown by step 101 a first semiconductor die is coupled to a package substrate. In the present embodiment, the first semiconductor die is coupled to the package substrate using adhesive. The package substrate can be a ball grid array package substrate. Alternatively, other types of package substrates could be used.

In one embodiment, adhesive is applied and the first die is placed over the package substrate in a first process step. The adhesive is then cured in a subsequent heating process step. The adhesive can be either a liquid or a solid adhesive (e.g., an adhesive tape). In one embodiment, a semiconductor die-attach adhesive is used that is formulated for attachment of semiconductor die. In one embodiment, the adhesive is a liquid polymer epoxy that is thermally conductive such as, for example, silver-filled epoxy.

Figure 2:
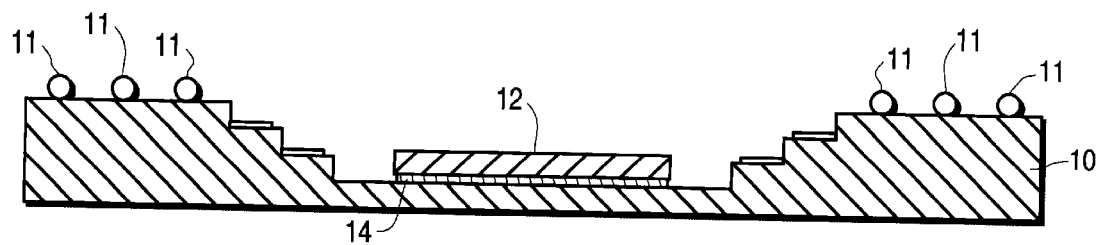
FIG. 2 shows a cross-sectional view of a semiconductor die coupled to a ball grid array package substrate in accordance with one embodiment of the present invention.

FIG. 2 shows an embodiment in which a semiconductor die 12 is coupled to a ball grid array package substrate 10. In this embodiment, adhesive layer 14 is disposed between semiconductor die 12 and ball grid array package substrate 10. Adhesive layer 14 attaches semiconductor die 12 to ball grid array package substrate 10.

As shown by step 102 of FIG. 1, wire bonds are coupled to the first semiconductor die and to the package substrate. This first set of wire bonds electrically couples the first semiconductor die to the package substrate. In the present embodiment an automated wire bonding apparatus is used for coupling wire bonds to the first semiconductor die and to the package substrate.

Figure 3:
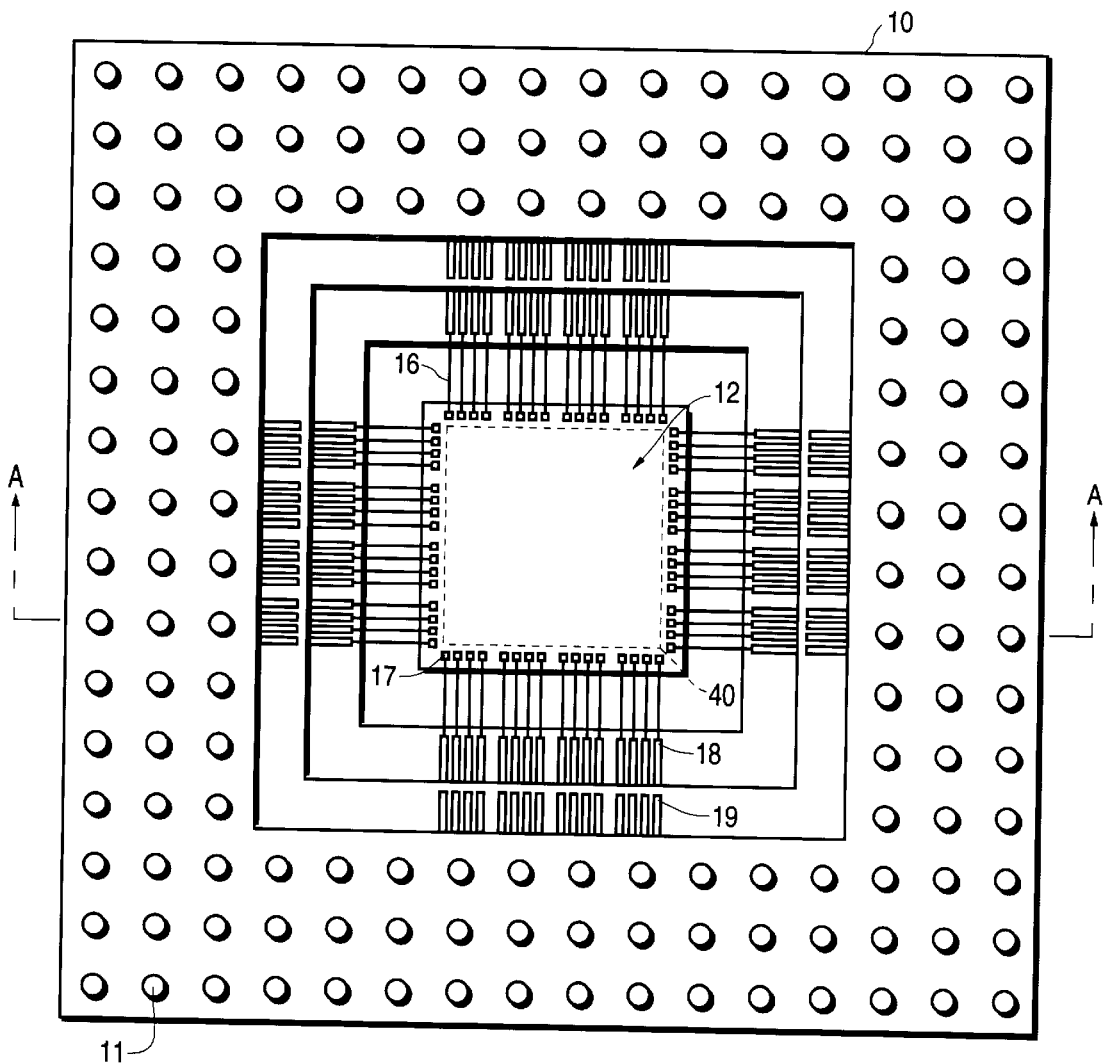
FIG. 3 is a top view of the structure of FIG. 2 after wire bonds have been coupled to the semiconductor die and to the ball grid array package substrate in accordance with one embodiment of the present invention.

Referring now to FIG. 3, semiconductor die 12 is shown to include bonding pads 17. In the present embodiment, bonding pads 17 are disposed on the top surface of semiconductor die 12 around the periphery of semiconductor die 12. Internal region 40 is indicated which is that portion of the top surface of semiconductor die 12 that lies inside of bonding pads 17.

Continuing with FIG. 3, ball grid array package substrate 10 includes bonding pads 18 that are disposed on a portion of ball grid array package substrate 10 that is raised relative to the center portion of ball grid array package substrate 10 to which semiconductor die 12 is attached. Ball grid array package substrate 10 also includes bonding pads 19 that are disposed on a portion of ball grid array package substrate 10 that is raised relative to bonding pads 18. It is appreciated that the number and placement of bonding pads 17–19 is illustrative and that the present invention is well adapted for the use of more or fewer bonding pads 17–19 and different placement of bonding pads 17–19.

Figure 4:
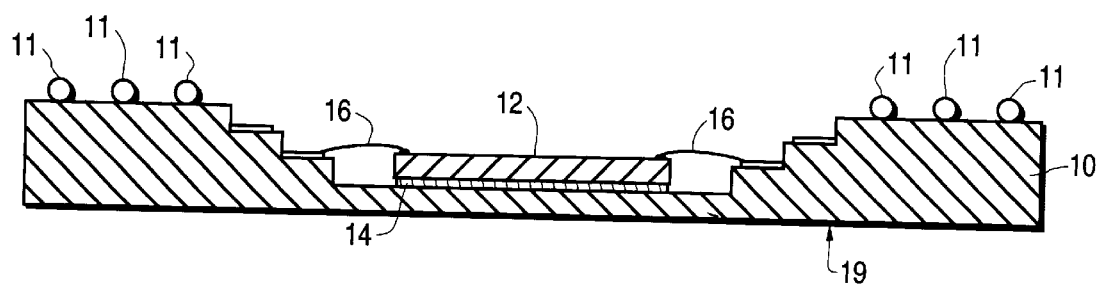
FIG. 4 is a cross-sectional view of the structure of FIG. 3 along cross section A—A in accordance with one embodiment of the present invention.

Referring now to FIGS. 3–4, ball grid array package substrate 10 is shown to include an array of solder balls 11 that are disposed on the top surface of ball grid array package substrate 10. Solder balls 11 electrically couple to ones of bonding pads 18–19. It is appreciated that the number and placement of solder balls in the present embodiment is illustrative and that the present invention is well adapted for the use of more or fewer solder balls 11 and different placement of solder balls 11. In one alternate embodiment, solder balls 11 are disposed on the bottom surface 19 of ball grid array package substrate 10.

Continuing with FIGS. 3–4, wire bonds 16 couple bonding pads 17 of semiconductor die 12 to bonding pads 18 of ball grid array package substrate 10. Thereby, wire bonds 16 electrically couple the circuitry of semiconductor die 12 to solder balls 11.

Referring to step 103 of FIG. 1, encapsulant is applied. In the present embodiment, encapsulant is applied such that the encapsulant is disposed over both the first semiconductor die and the wire bonds. In the embodiment shown in FIGS. 5–6, encapsulant is applied within the central portion of ball grid array package substrate 10 such that all of bonding pads 17–18 and wire bonds 16 are completely covered.

As shown by step 104 of FIG. 1, the encapsulant is cured. In one embodiment the encapsulant is fully cured. In another embodiment, the encapsulant is only partially cured.

The curing process varies depending on the type of encapsulant used. In one embodiment, an epoxy-based polymer encapsulant is used that is fully cured by heating the encapsulant for a time specified by the encapsulant manufacturer. In one embodiment, an epoxy-based polymer encapsulant is used that is partially cured by heating the encapsulant for seventy-five percent of the amount of time specified by the encapsulant manufacturer.

Figure 5:
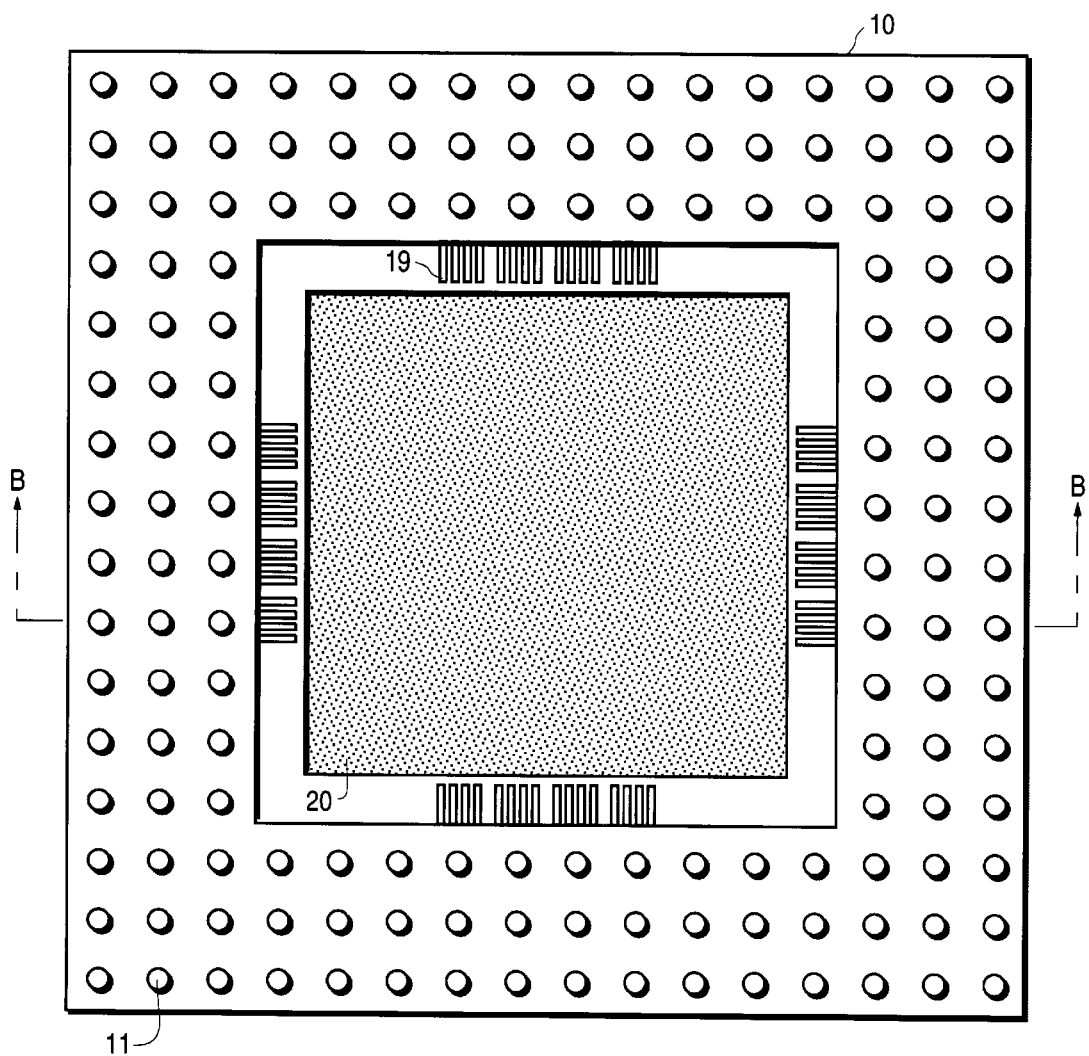
FIG. 5 is a top view of the structure of FIG. 3 after encapsulant has been applied and cured so as to form a first layer of encapsulant in accordance with one embodiment of the present invention.
Figure 6:
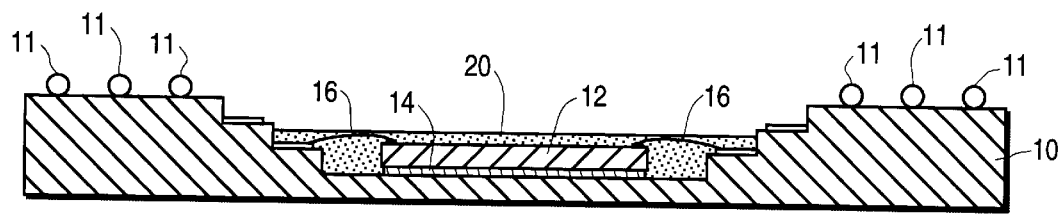
FIG. 6 is a cross-sectional view of the structure of FIG. 5 along cross section B—B in accordance with one embodiment of the present invention.

Referring now to FIGS. 5–6, once the curing process is completed an encapsulant layer 20 is formed that completely covers semiconductor die 12, and completely covers each of wire bonds 16. Encapsulant layer 20 protects and insulates semiconductor die 12 and wire bonds 16. Accordingly, semiconductor die 12 and wire bonds 16 are protected and are not damaged in subsequent process steps. Also, because there is no spacer and no overlying semiconductor die to trap air, voids do not form within encapsulant layer 20 as occurs in prior art fabrication processes that use spacers.

Referring now to step 105 of FIG. 1, the second semiconductor die is coupled to the first encapsulant layer. In the present embodiment, the second semiconductor die is coupled to the first encapsulant layer using adhesive. In the embodiment shown in FIG. 7, semiconductor die 22 is shown to be attached to layer of encapsulant 20 by adhesive layer 24.

In one embodiment, the uncured adhesive is applied and the second semiconductor die 22 is placed over the encapsulant layer 20 in a first process step. The adhesive is then cured in a subsequent heating process step.

Adhesive layer 24 can be formed using either a liquid or a solid adhesive (e.g., an adhesive tape). In one embodiment, the same adhesive is used that is used in step 101 of FIG. 1. However, a different adhesive could also be used. In the present embodiment, a thermally conductive liquid polymer die-attach adhesive is used such as, for example, silver-filled epoxy adhesive.

In the present embodiment, semiconductor die 22 is shown to be disposed over semiconductor die 12 such that semiconductor die 22 completely overlies semiconductor die 12. However, alternatively, semiconductor die 22 could be offset such that it only partially overlies semiconductor die 12. In yet another embodiment, semiconductor die 22 could be offset such that it does not overlie semiconductor die 12 at all.

Figure 7:
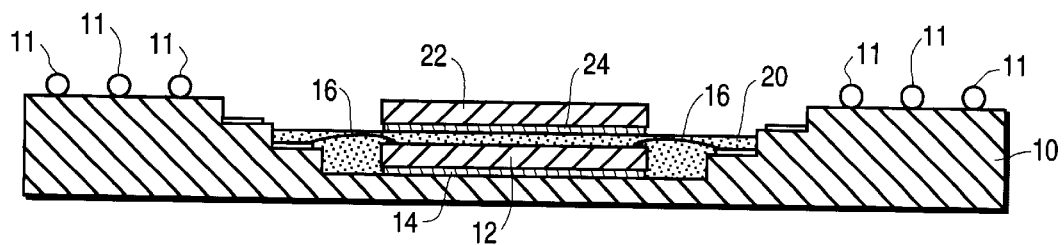
FIG. 7 is a cross-sectional view of the structure of FIG. 6 after a second semiconductor die has been coupled to the first layer of encapsulant in accordance with one embodiment of the present invention.

Because layer of encapsulant 20 fully supports semiconductor die 22, and separates semiconductor die 22 from semiconductor die 12, there is no need for a separate supporting structure (e.g., a spacer) as is used in prior art fabrication processes. Accordingly, in the method and apparatus of the present invention, no supporting structure (e.g., a spacer) extends between semiconductor die 12 and semiconductor die 22. Referring to FIG. 7, only encapsulant (portions of encapsulant layer 20) and adhesive (portions of adhesive layer 14) are disposed above the top surface of semiconductor die 12, within internal region 40 (FIG. 3), and below semiconductor die 22.

As shown by step 106 of FIG. 1, wire bonds are coupled to the second semiconductor die and coupled to the package substrate. This second set of wire bonds electrically couples the second semiconductor die to the package substrate.

Figure 8:
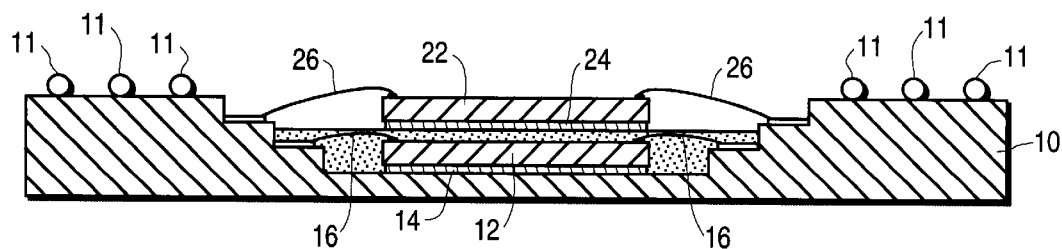
FIG. 8 is a cross-sectional view of the structure of FIG. 7 after the second semiconductor die has been electrically coupled to the ball grid array package substrate using wire bonds in accordance with one embodiment of the present invention.
Figure 9:
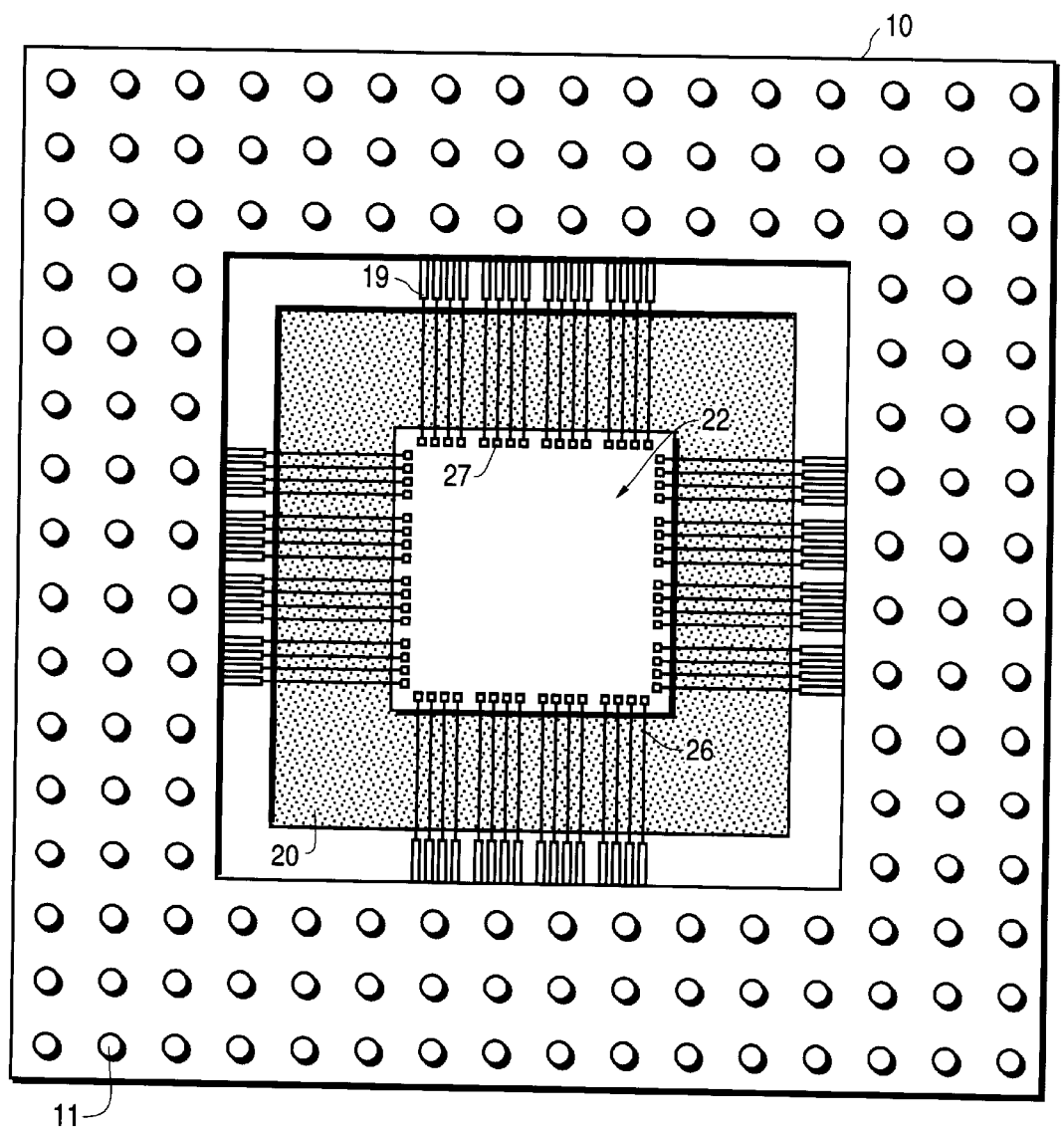
FIG. 9 is a top view of the structure of FIG. 8 in accordance with one embodiment of the present invention.

In the embodiment shown in FIGS. 8–9, semiconductor die 22 is shown to include bonding pads 27 that couple to the internal circuitry of semiconductor die 22. In the present embodiment, bonding pads 27 are disposed on the top surface of semiconductor die 12 around the periphery of semiconductor die 22.

Continuing with FIGS. 8–9, wire bonds 26 are coupled on one end to bonding pads 27 and coupled on the opposite end to ones of bonding pads 19. Wire bonds 26 electrically couple bonding pads 27 of semiconductor die 22 to bonding pads 19 of ball grid array package substrate 10. Thereby, wire bonds 26 electrically couple the circuitry of semiconductor die 22 to solder balls 11.

Referring now to step 107 of FIG. 1, encapsulant is applied. In the present embodiment, encapsulant is applied such that the encapsulant is disposed over both semiconductor die 22 and wire bonds 26. In the embodiment shown in FIGS. 8–9, encapsulant is applied within the central portion of ball grid array package substrate 10 such that all of bonding pads 27, bonding pads 19 and wire bonds 26 are completely covered.

As shown by step 108 of FIG. 1, the encapsulant is cured. In the present embodiment the encapsulant is fully cured. The curing process varies depending on the type of encapsulant used. In one embodiment, an epoxy-based polymer encapsulant is used that is fully cured by heating the encapsulant for a time specified by the encapsulant manufacturer.

When the encapsulant applied in step 103 is only partially cured in step 104, better adhesion can result between the top surface of the encapsulant applied in step 103 and the bottom surface of the encapsulant applied in step 107. However, depending on the type of encapsulant used for performing step 103 and the type of encapsulant used for performing step 107, partial curing may or may not be required. Moreover, depending on the type of encapsulant used for performing step 103 and the type of encapsulant used for performing step 107, the amount of partial curing will vary.

Figure 10:
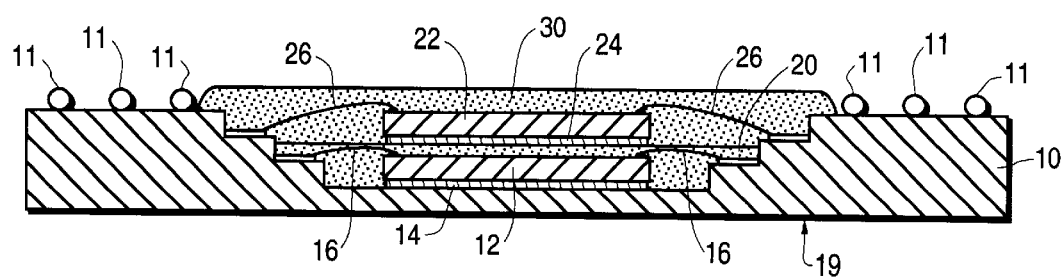
FIG. 10 is a cross-sectional view of the structure of FIG. 8 after encapsulant has been applied and cured so as to form a packaged semiconductor device in accordance with one embodiment of the present invention.
Figure 11:
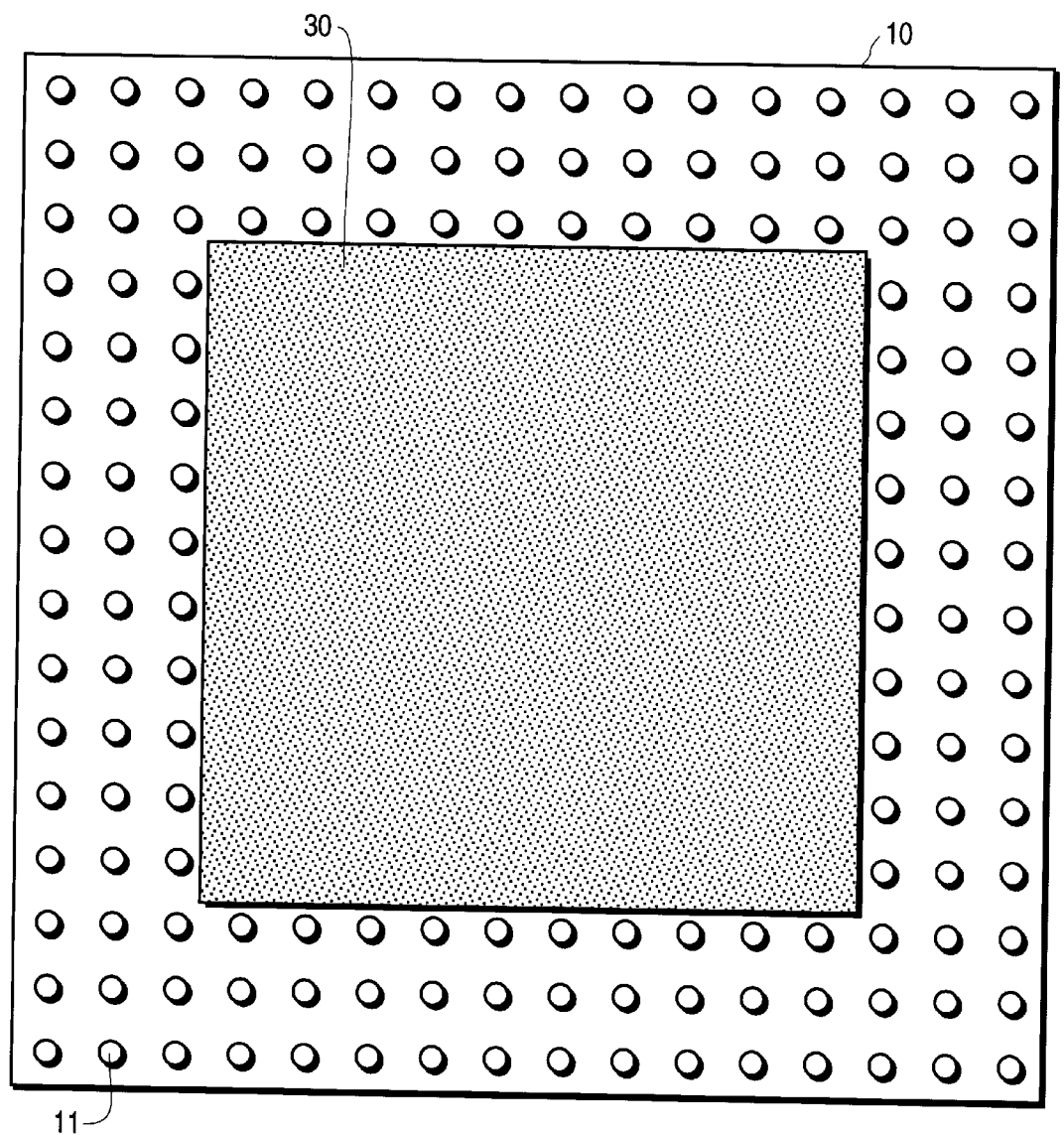
FIG. 11 is a top view of the structure of FIG. 10 in accordance with one embodiment of the present invention.

Referring now to FIGS. 10–11, once the curing process is completed, an encapsulant layer 30 is formed that completely covers semiconductor die 22, and completely covers each of wire bonds 26. Because there is no spacer and no overlying semiconductor die to trap air, voids do not form within encapsulant layer 20 as occurs in prior art fabrication processes that use spacers.

Because voids do not form within encapsulant layers 20 and 30, the method and apparatus of the present invention avoids the reliability problems and integrity problems that occur in prior art fabrication processes that use spacers. Also, by forming a first encapsulant layer 20 that covers die 12 and wire bonds 16, prior to performing steps 105–108, die 12 and wire bonds 16 are protected during process steps 105–108. This results in higher manufacturing yield and lower defect rates.

In the method and apparatus of the present invention no spacer is required for separating the first semiconductor die from the second semiconductor die. This results in cost savings as there is no need to procure or precisely locate a spacer as is required in prior art assembly methods. In addition, the method and apparatus of the present invention does not result in voids that can trap air as occurs in prior art assembly methods. Accordingly, reliability and structural integrity of the resulting packaged semiconductor device is improved.

In the present embodiment, adhesive layers 14, 24 and encapsulant layers 20, 30 are disclosed to be epoxy. However, the nature of the epoxy that is an adhesive is fundamentally different in its characteristics from the epoxy that is an encapsulant. More particularly, the primary function of an adhesive is to adhere to and attach adjoining structures. In contrast, the primary function of encapsulant is to enclose, insulate and protect.

Method 100 is illustrated in FIGS. 1–11 as being applied for forming a stacked-die structure that includes only two die. However, additional stacked-die could be added by repeating steps 105–108 for each subsequent die. Thereby, packaged semiconductor devices having three, four, or even more stacked die could be formed.

The preferred embodiment of the present invention is thus described. While the present invention has been described in particular embodiments, it should be appreciated that the present invention should riot be construed as limited by such embodiments, but rather construed according to the following claims.

What is claimed is:

1. A method for forming a packaged semiconductor device comprising:

coupling a first semiconductor die to a package substrate;

coupling a plurality of wire bonds to said first semiconductor die and to said package substrate so as to electrically couple said first semiconductor die to said package substrate;

disposing encapsulant over said first semiconductor die and over said plurality of wire bonds;

at least partially curing said encapsulant;

coupling a second semiconductor die to said encapsulant, said second semiconductor die at least partially overlying said first semiconductor die; and electrically coupling said second semiconductor die to said package substrate.

2. A method for forming a packaged semiconductor device as recited in claim 1 wherein said coupling a second semiconductor die to said encapsulant comprises attaching said second semiconductor die to said encapsulant using adhesive.

3. A method for forming a packaged semiconductor device as recited in claim 2 wherein said package substrate comprises a ball grid array package substrate.

4. A method for forming a packaged semiconductor device as recited in claim 3 wherein only said encapsulant and said adhesive extend between said first semiconductor die and said second semiconductor die, and extend above an internal region of the top surface of said first semiconductor die, said internal region including that portion of the top surface of said first semiconductor die that lies inside of any bonding pads that are disposed within said top surface of said first semiconductor die.

5. A method for forming a packaged semiconductor device as recited in claim 1 wherein said curing said encapsulant comprises fully curing said encapsulant.

6. A method for forming a packaged semiconductor device as recited in claim 1 wherein said encapsulant comprises an epoxy-based polymer encapsulant.

7. A method for forming a packaged semiconductor device as recited in claim 2 wherein electrically coupling said second semiconductor die to said package substrate comprises attaching an additional set of wire bonds to said second semiconductor die and to said package substrate.

8. A method for forming a packaged semiconductor device as recited in claim 7 further comprising the step of:

applying encapsulant such that said encapsulant is disposed over said second semiconductor die and over said additional set of wire bonds.

9. A method for forming a packaged semiconductor device comprising:

coupling a first semiconductor die to a ball grid array package substrate using adhesive;

coupling a first set of wire bonds to said first semiconductor die and to said ball grid array package substrate such that said first semiconductor die is electrically coupled to said ball grid array substrate;

forming a first layer of encapsulant that covers said first semiconductor die and said first set of wire bonds;

coupling a second semiconductor die to said first layer of encapsulant using adhesive, said second semiconductor die at least partially overlying said first semiconductor die;

coupling a second set of wire bonds to said second semiconductor die and to said ball grid array package substrate such that said second semiconductor die is electrically coupled to said ball grid array package substrate; and forming a second layer of encapsulant that covers said second semiconductor die and covers said second set of wire bonds.

10. A method for forming a packaged semiconductor device as recited in claim 9 wherein only portions of said first layer of encapsulant and portions of said adhesive extend between said first semiconductor die and said second semiconductor die and above an internal region of the top surface of said first semiconductor die, said internal region including that portion of the top surface of said first semiconductor die that lies inside of any bonding pads that are disposed within said top surface of said first semiconductor die.

11. A method for forming a packaged semiconductor device as recited in claim 10 wherein said forming a first layer of encapsulant comprises disposing encapsulant and at least partially curing said encapsulant.

12. A method for forming a packaged semiconductor device as recited in claim 11 wherein said at least partially curing said encapsulant comprises fully curing said encapsulant.

* * * * *

UNITED STATES PATENT AND TRADEMARK OFFICE
CERTIFICATE OF CORRECTION

PATENT NO. : 6,686,221 B1  Page 1 of 1
DATED : February 3, 2004
INVENTOR(S) : Anne T. Katz It is certified that error appears in the above-identified patent and that said Letters Patent is hereby corrected as shown below:

Title page,
Item [22], PCT filing date, should read -- Aug. 29, 2002 --.

Column 6,
Line 51, the word "riot" should read -- not --.

Column 8,
Line 4, the phrase "ball grid array substrate" should read -- ball grid array package substrate --.

Signed and Sealed this

Seventeenth Day of August, 2004

JON W. DUDAS
*Acting Director of the United States Patent and Trademark Office*